(12) United States Patent
Chu et al.

(10) Patent No.: US 11,264,486 B2
(45) Date of Patent: Mar. 1, 2022

(54) SEMICONDUCTOR STRUCTURE AND METHOD OF FABRICATING THE SEMICONDUCTOR STRUCTURE

(71) Applicant: TAIWAN SEMICONDUCTOR MANUFACTURING COMPANY LTD., Hsinchu (TW)

(72) Inventors: Chung-Hao Chu, Hsinchu (TW); Chia-Chung Chen, Keelung (TW); Shu Fang Fu, Hsinchu County (TW); Chi-Feng Huang, Hsinchu County (TW); Victor Chiang Liang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 62 days.

(21) Appl. No.: 16/744,811

(22) Filed: Jan. 16, 2020

(65) Prior Publication Data
US 2021/0226043 A1 Jul. 22, 2021

(51) Int. Cl.
*H01L 21/00* (2006.01)
*H01L 29/66* (2006.01)
*H01L 21/8234* (2006.01)
*H01L 29/78* (2006.01)

(52) U.S. Cl.
CPC .......... *H01L 29/66795* (2013.01); *H01L 21/823431* (2013.01); *H01L 29/785* (2013.01)

(58) Field of Classification Search
CPC ..... H01L 21/823431; H01L 21/823475; H01L 21/823481; H01L 21/823493; H01L 29/0649; H01L 29/66795; H01L 29/785; H01L 29/7851; H01L 2029/7858
See application file for complete search history.

(56) References Cited

U.S. PATENT DOCUMENTS

| | | | |
|---|---|---|---|
| 7,910,413 B2 | 3/2011 | Zhu | |
| 9,911,697 B2* | 3/2018 | Chen | H01L 23/5222 |
| 10,170,422 B2* | 1/2019 | Chen | H01L 21/845 |
| 10,236,215 B1* | 3/2019 | Xie | H01L 27/0886 |
| 10,276,499 B2* | 4/2019 | Peng | H01L 21/76892 |
| 10,629,682 B2* | 4/2020 | Do | H01L 29/7827 |
| 10,861,790 B2* | 12/2020 | Chen | H01L 23/5222 |
| 11,113,443 B1* | 9/2021 | Chang | G06F 30/327 |
| 2012/0217467 A1 | 8/2012 | Tan et al. | |
| 2015/0311122 A1* | 10/2015 | Rashed | H01L 21/823475 257/401 |
| 2016/0372316 A1* | 12/2016 | Yang | H01L 27/0207 |
| 2017/0117272 A1* | 4/2017 | Sio | H01L 23/5226 |
| 2017/0154848 A1* | 6/2017 | Fan | H01L 27/0207 |
| 2018/0096935 A1* | 4/2018 | Kim | H01L 23/535 |
| 2018/0174967 A1* | 6/2018 | Chen | H01L 21/823871 |

(Continued)

*Primary Examiner* — Laura M Menz
(74) *Attorney, Agent, or Firm* — WPAT, P.C., Intellectual Property Attorneys; Anthony King

(57) ABSTRACT

The present disclosure provides a semiconductor device, including a substrate, a fin over the substrate, wherein the fin extends along a primary direction, a gate over the fin, the gate extends along the secondary direction orthogonal to the primary direction, a first conductive contact over the gate, and a conductive routing layer over the first conductive contact, wherein at least a portion of the fin is free from the coverage of a vertical projection of the conductive routing layer.

20 Claims, 10 Drawing Sheets

(56) References Cited

U.S. PATENT DOCUMENTS

2018/0374792 A1* 12/2018 Wee ...................... H01L 29/785
2019/0122987 A1*  4/2019 Chen ...................... H01L 21/845
2019/0371933 A1* 12/2019 Chen ...................... H01L 29/78
2021/0226043 A1*  7/2021 Chu ................ H01L 21/823475

* cited by examiner

SEMICONDUCTOR STRUCTURE AND METHOD OF FABRICATING THE SEMICONDUCTOR STRUCTURE

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) devices. The use of FinFET devices has been gaining popularity in the semiconductor industry. FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

A typical FinFET device is fabricated with a thin fin-like structure called a "fin", extending from a substrate, and a gate provided over (e.g., wrapping around) the fin. The fin structure is made of semiconductor material, typically silicon, and if used as a transistor, has a current channel formed inside. When the FinFET device is used as a transistor, the gate is used to control the current in the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
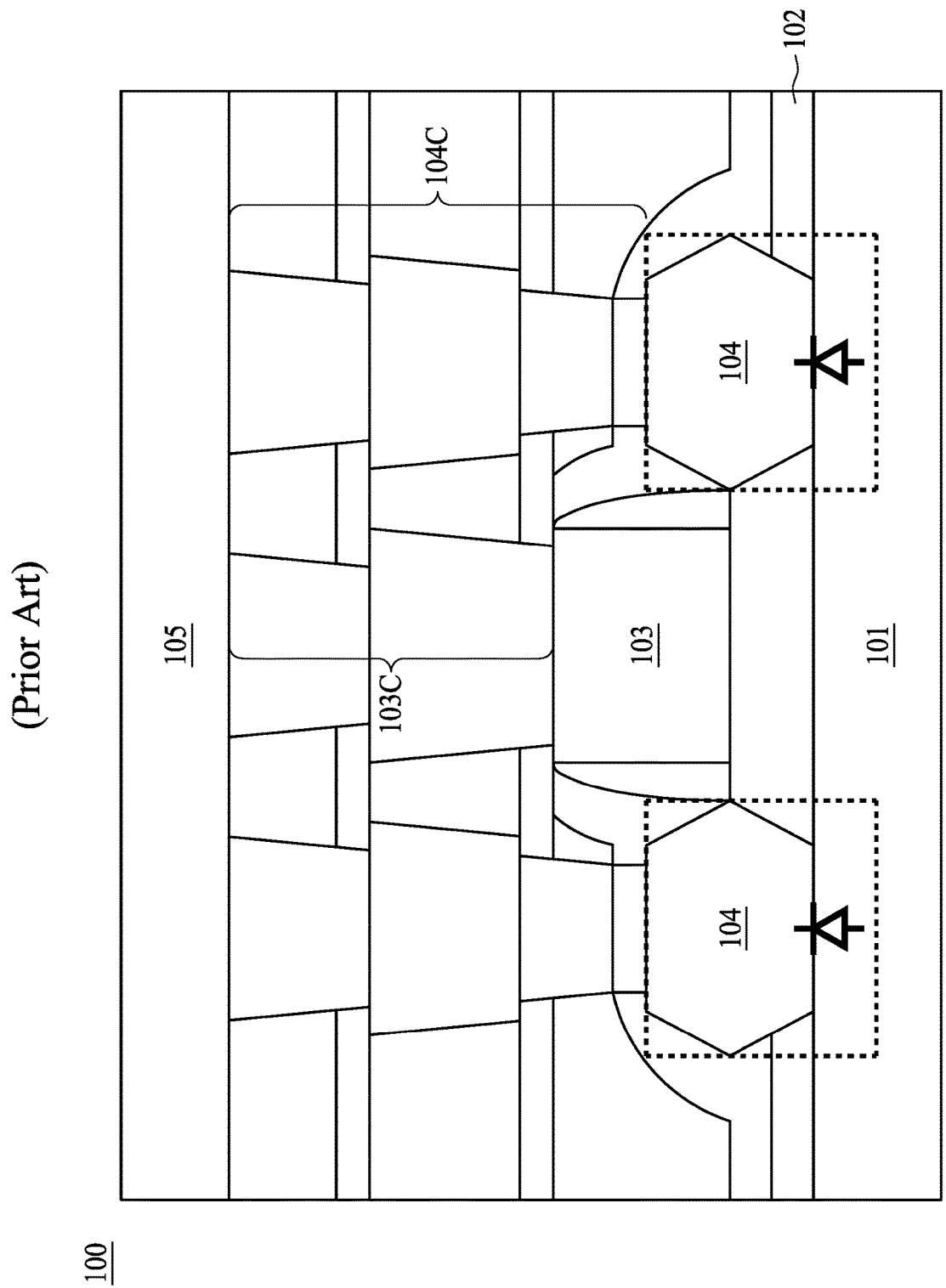
FIG. 1 is a cross sectional view of a semiconductor structure, according to a comparative embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Electrostatic discharge (ESD) protection is provided to protect circuitry of semiconductor devices in the presence of an ESD event. The ESD event causes a voltage stress to the semiconductor device. The voltage stress is usually in the kilo-volts range. If the voltage stress is not prevented, the voltage stress could cause damages such as via induced metal island corrosion (VIMIC), breakdown, metal electromigration, gate oxide rupture, etc., to the semiconductor device. A protection diode can be incorporated to a FinFET structure to alleviate ESD, wherein an active area of the protection diode can produce junction leakage current (or injection current). Such junction leakage current may enhance the current conduction ability for distributing away electrons. Generally, the efficiency of the protection diode can be defined by injection current generated per unit cell area. In some embodiments, the junction leakage current (or injection current) is photo-induced.

However, compared to planar semiconductor diodes, the diodes constructed by using the FinFET structure have a shortcoming of degradation, which is caused by reduced photons received by active area and/or reduced quantum efficiency of the device. For example, the active area may be blocked by conductive lines. For another example, the junction area may not be large enough to alleviate ESD.

Therefore, the present disclosure provides a semiconductor structure and a method for fabricating the semiconductor to improve the efficiency of ESD protection, thereby enhancing the performance of semiconductor devices.

It should be understood that the present disclosure may be applicable to various semiconductor technologies, for example, silicon fin structures, silicon on insulator (SOI), complementary metal oxide semiconductor (CMOS), silicon germanium (SiGe) fin, or the like.

Referring to FIG. 1, FIG. 1 is a cross sectional view of a semiconductor structure, according to a comparative embodiment. A semiconductor device 100 includes a substrate 101, a gate 103 over the substrate 101, a semiconductor material 104 adjacent to the gate 103, a first conductive contact 103C over the gate 103, a second conductive contact 104C over the semiconductor material 104, and a conductive routing layer 105 (which may include metal) and electrically connected to the first conductive contact 103C and the second conductive contact 104C. The semiconductor material 104 and/or the gate 103 are entirely under a vertical projection are of the conductive routing layer 105. Herein the gate 103 is directly over a fin (such as an active FinFET) of the substrate 101. An isolation region 102 is optionally disposed over the substrate 101 and under the gate 103. In some embodiments, the semiconductor material 104 includes epitaxial material (such as SiP epitaxy, or the like), wherein conductive regions (e.g. source/drain regions) are formed under the semiconductor material 104, and are around a channel region under the gate 103. A junction of diode (or an active area) may be formed at the interface between the semiconductor material 104 and the substrate 101.

However, as previously discussed, the conductive area (or active area) of the semiconductor device 101 (e.g. source/drain region) is blocked by the conductive routing layer 105. In the case of junction leakage current can be induced by incident photons in some operations (for example, plasma operations), the injection current generated in the active area of the semiconductor device 100 is reduced since a greater portion of photons may be blocked by conductive routing layer 105 and may not be allowed to reach the active area. Therefore, the generated junction leakage current is reduced, thereby lowering the performance of alleviating electrostatic discharge that can be a factor of inducing defects.

Figure 2:
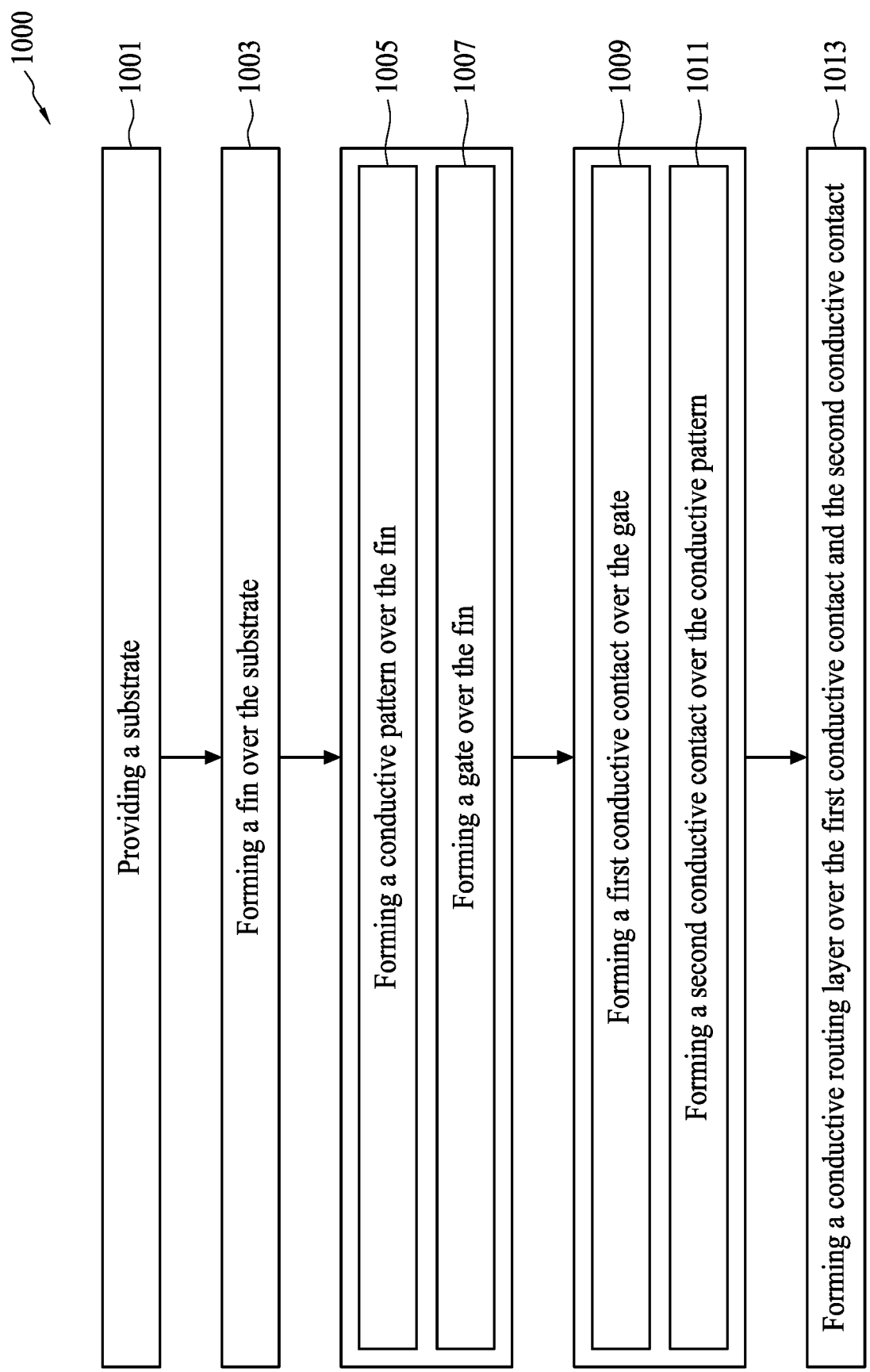
FIG. 2 shows a flow chart representing a method for fabricating a semiconductor structure, in accordance with some embodiments of the present disclosure.

Referring to FIG. 2, FIG. 2 shows a flow chart representing a method for fabricating a semiconductor structure, in accordance with some embodiments of the present disclosure. The method 1000 for fabricating a semiconductor structure includes providing a substrate (operation 1001, which can be referred to FIG. 3A to FIG. 3D), forming a fin over the substrate (operation 1003, which can be referred to FIG. 3A to FIG. 3D), forming a conductive pattern over the fin (operation 1005, which can be referred to FIG. 3A to FIG. 3D), forming a gate over the fin (operation 1007, which can be referred to FIG. 3A to FIG. 3D), forming a first conductive contact over the gate (operation 1009, which can be referred to FIG. 3A to FIG. 3D), forming a second conductive contact over the conductive pattern (operation 1011, which can be referred to FIG. 3A to FIG. 3D), and forming a conductive routing layer over the first conductive contact and the second conductive contact (operation 1013, which can be referred to FIG. 3A to FIG. 3D).

Figure 3A:
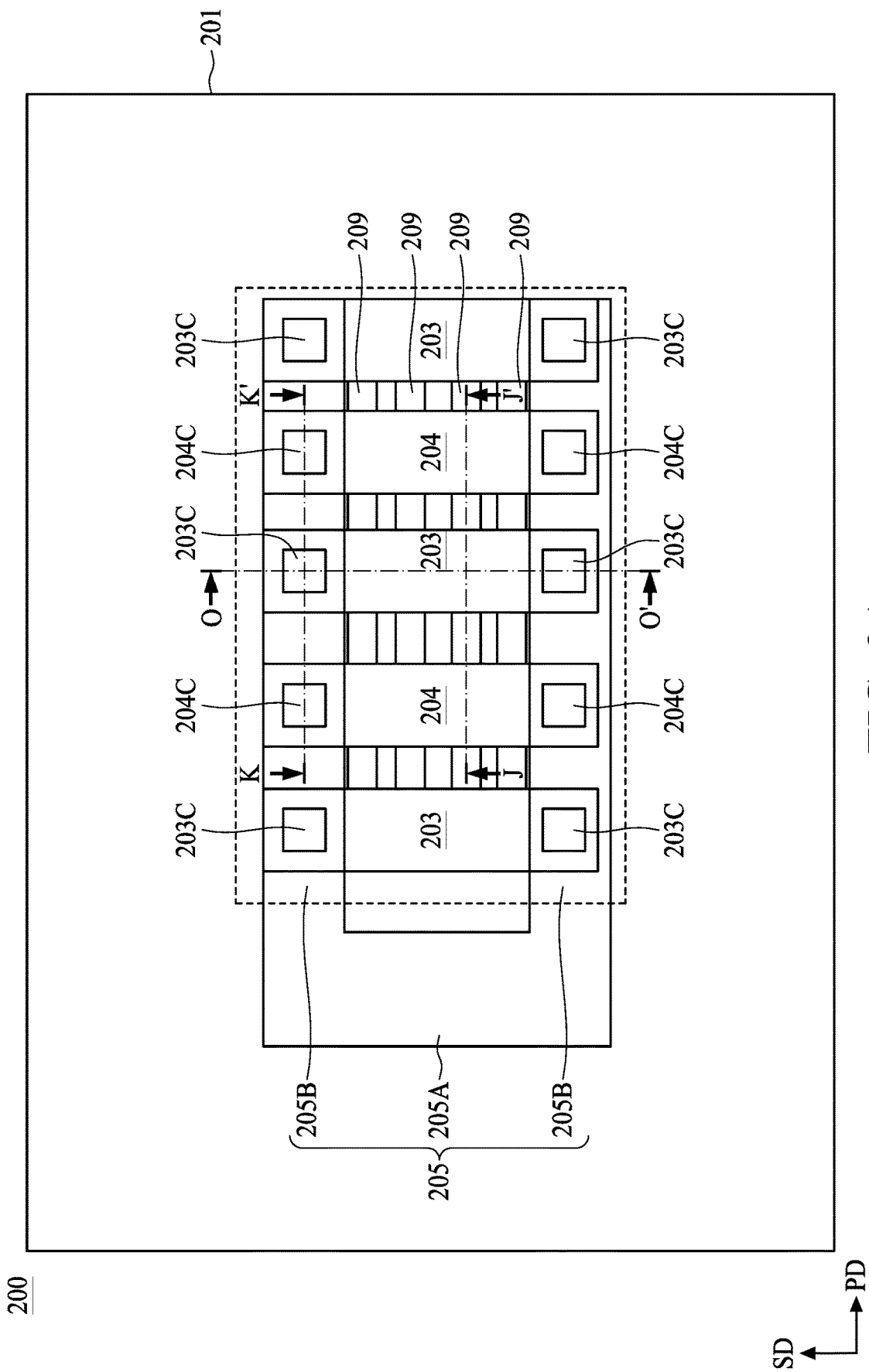
FIG. 3A is a top sectional view of a semiconductor structure, according to some embodiments of the present disclosure.
Figure 3B:
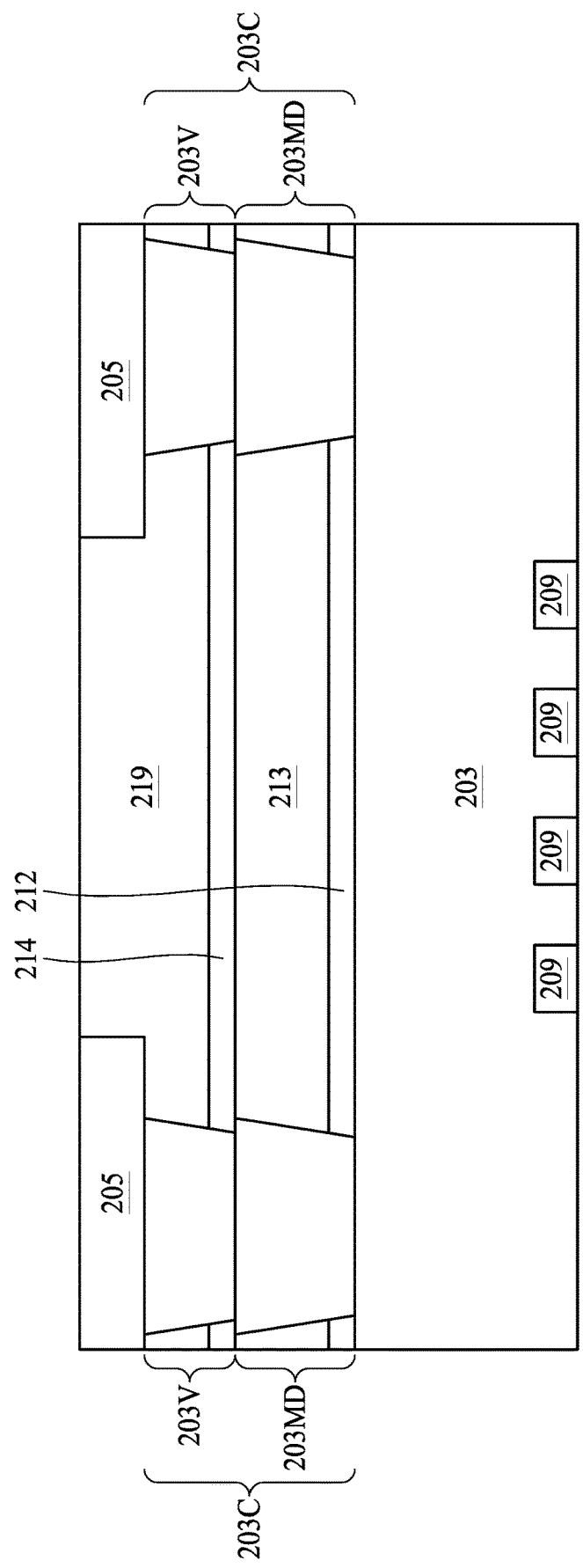
FIG. 3B is a schematic drawing illustrating a cross sectional view taken along line O-O' of FIG. 3A, according to some embodiments of the present disclosure.
Figure 3C:
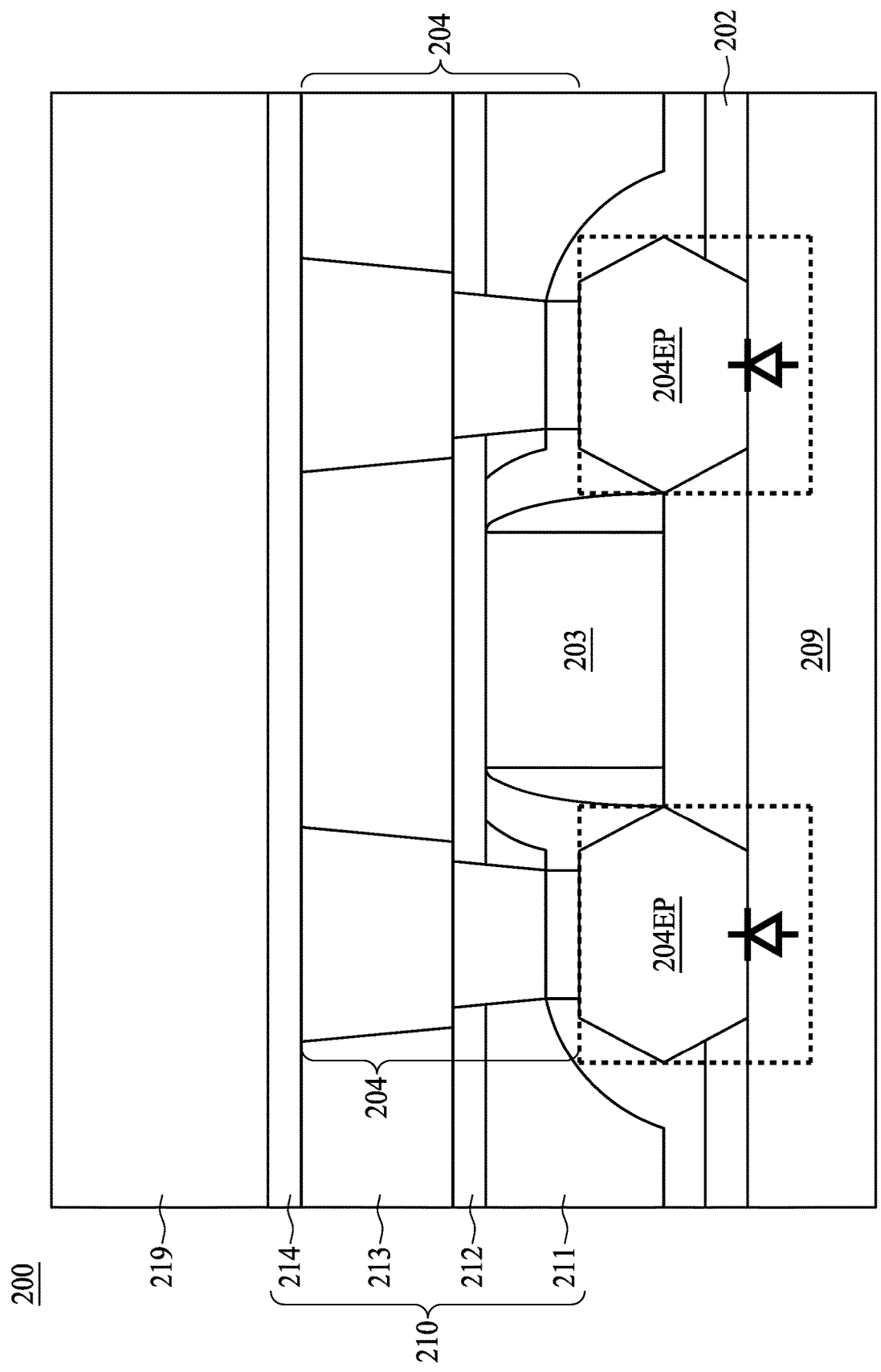
FIG. 3C is a schematic drawing illustrating a cross sectional view taken along line J-J' of FIG. 3A, according to some embodiments of the present disclosure.
Figure 3D:
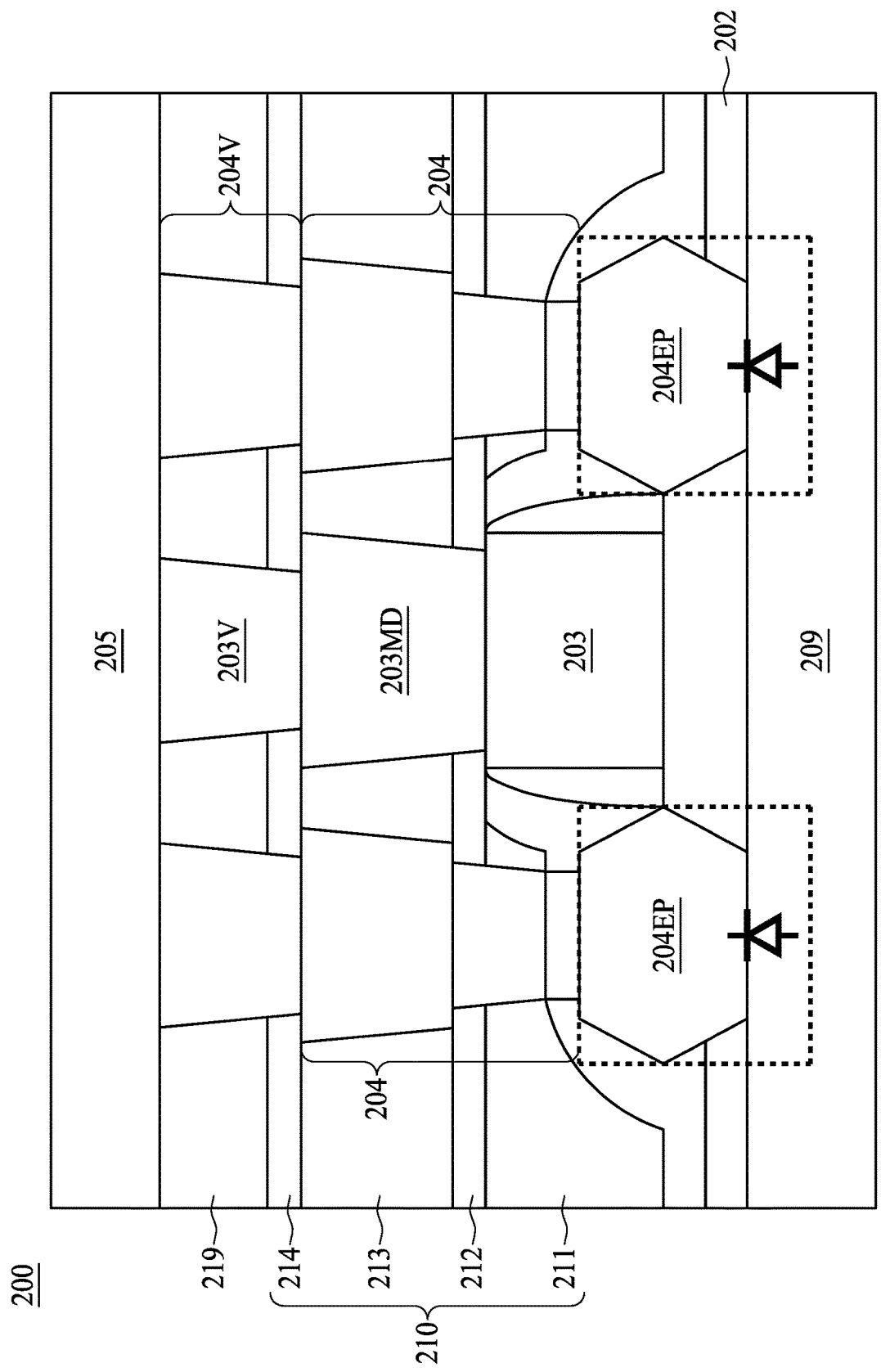
FIG. 3D is a schematic drawing illustrating a cross sectional view taken along line K-K' of FIG. 3A, according to some embodiments of the present disclosure.

Referring to FIG. 3A to FIG. 3D, FIG. 3A is a top sectional view of a semiconductor structure, according to some embodiments of the present disclosure, FIG. 3B is a schematic drawing illustrating a cross sectional view taken along line O-O' of FIG. 3A, FIG. 3C is a schematic drawing illustrating a cross sectional view taken along line J-J' of FIG. 3A, and FIG. 3D is a schematic drawing illustrating a cross sectional view taken along line K-K' of FIG. 3A. The semiconductor device 200 at least includes a substrate 201 and a plurality of fins 209 formed over the substrate 201 and extends along a primary direction PD. The fins 209 may include silicon or other semiconductor materials. The fins 209 may optionally be covered by an insulation layer. Optionally, an isolation region 202 can be formed above the substrate 201 and/or the fin 209. In some embodiments, the fins 209 may be active fins. It should be noted that the term "active" in the present disclosure may be referred to being adapted to function electrically in the semiconductor device 200 when applied under certain condition of power. Accordingly, an "active region" in the present disclosure can be referred to regions that are involved in electrical functions when applied under certain condition of power, which may include but not limited to, source regions, drain regions, and/or channel regions. The fins 209 are often referred to as "OD patterns", i.e. oxide-define patterns. The OD patterns are configured to define active devices.

A gate 203 (for example, a metal gate, or the like) is disposed above and the substrate 201 and partially covers the fins 209, and the gate 203 extends along a secondary direction SD different from the primary direction PD. In some embodiments, the secondary direction SD is orthogonal to the primary direction PD. A semiconductor material 204EP is disposed adjacent to the gate 203, wherein the semiconductor material 204EP may include epitaxial material (such as SiP epitaxy, silicon germanium, or the like), wherein conductive regions (e.g. source/drain regions) are formed under the semiconductor material 204EP, and are around a channel region under the gate 203. A junction of diode (or an active area) may be formed at the interface between the semiconductor material 204EP and the fin 209.

A first conductive contact 203C is disposed above the gate 203, and a second conductive contact 204C is disposed over the semiconductor material 204EP. The gate 203 and the semiconductor material 204EP are electrically connected to a conductive routing layer 205 (which may include metal) over the substrate 201. The first conductive contact 103C includes a conductive pattern 203MD directly above the gate 203 and a via 203V connecting between the conductive pattern 203MD and the conductive routing layer 205. The second conductive contact 204C includes a conductive pattern 204 directly above the semiconductor material 204EP and a via 204V connecting between the conductive pattern 204 and the conductive routing layer 205. In some embodiments, the conductive patterns 204 extend along the secondary direction SD. The first conductive contact 203C and the second conductive contact 204C are surrounded by an insulation layer 210. The insulation layer 210 may include multiple layers, for example, an inter-layer dielectric (ILD) layer 211 over the substrate 201 and surrounding the gate 203, a silicon nitride layer 212 over the ILD layer 211 and the gate 203, a Poly(ethylene oxide) (PEOX) layer 213 over the silicon nitride layer 212, a silicon carbide layer 214 over the PEOX layer 213, and the silicon carbide layer 214 is covered by a dielectric layer 219 (which may be a low-k dielectric in some embodiments). In such example, the silicon carbide layer 214 is above the conductive pattern 203MD and the conductive pattern 204; the vias 203V and 204V are surrounded by the silicon carbide layer 214 and the dielectric layer 219, and the conductive routing layer 205 is in the dielectric layer 219. It should be noted that the configuration of the insulation layer 210 is not limited to the aforesaid example. The configuration of the insulation layer 210 can be changed based on design rule or needs.

The conductive pattern 204 is often referred to as "MD patterns" or "MOOD patterns", i.e. metal-zero-over-oxide pattern. The MD patterns are configured to define electrical connection from the active devices (which may include the source/drain region) formed in the fins 209 to an outside circuitry. In some embodiments, a material of the conductive patterns 204 includes metal, such as copper. In some embodiments, the conductive patterns 204 herein belong to zeroth metal layer (often referred to as MO layer or metal-zero layer), which is the lowermost metal layer above the active region of the fins 209. Accordingly, the conductive routing layer 205 over the substrate 201 is a first metal layer (often referred to as Ml layer) above the zeroth metal layer. A certain numbers of fins 209, gate 203, and conductive patterns 204 constitute a block 299, wherein the semiconductor device 200 may include a plurality of blocks 299 (which may optionally be configured in repeated pattern).

In some embodiments, the first conductive contact 203C and/or the second conductive contact 204C can be formed by single damascene process, dual damascene process, or a combination of deposition and etching operations. As previously discussed, increasing the junction leakage current induced in an active area of the fins 209 may alleviate electrostatic issue, wherein the junction leakage current may be induced by photons. Specifically, by a configuration of at least a portion of the fin(s) 209 being free from the coverage of a vertical projection of the conductive routing layer 205, thereby an active area can be irradiated by incident photons, especially during some fabricating operations that may cause ESD issues (such as plasma operation). In order to allow the more photons to reach the fins 209 without blocked by conductive routing layer 205, a portion of the circuit block 299 (which includes a certain numbers of fins 209, gates 203, and conductive patterns 204) is free from being covered by the conductive routing layer 205. Alternatively, the conductive routing layer 205 includes a through hole which allows photons to propagate toward the active area.

In some embodiments, at least a portion of the gate 203 is free from the coverage of a vertical projection of the conductive routing layer 205. In some embodiments, conductive region (e.g. source/drain region) adjacent to the gate 203 is free from the coverage of a vertical projection of the conductive routing layer 205. In some embodiments, the semiconductor material 204EP is free from the coverage of a vertical projection of the conductive routing layer 205.

In some embodiments, in order to further improve the performance of alleviating ESD issues, an area of the block 299 being free from the coverage of a vertical projection of the conductive routing layer 205 is increased. For example, the via 203V of first conductive contact 203C and the via 204V of the second conductive contact 204C can be disposed at a position proximal to the ends of the gates 203 and the conductive patterns 204. Optionally, in some embodiments, some of the vias 203V and 204V can be aligned along a certain axis, such as along the primary direction PD in the example of FIG. 3A. Optionally, in some of the embodiments, all (or greater number of) the fins 209 are between two of the vias 203V of the first conductive contact 203C (or two of the vias 204V of the second conductive contact 204C) at both ends of the gates 203 (or the conductive patterns 204), but the present disclosure is not limited thereto.

In the example provided in FIG. 3A, a first portion 205A of the conductive routing layer 205 is outside of a vertical projection of the fins 209, the gates 203, and the conductive pattern 204 of the block 299. The conductive routing layer 205 further includes one or more second portion 205B overlapping with at least a portion of the conductive pattern 204 and the gates 203 from a top view perspective. In the example provided in FIG. 3A, the first portion 205A extends along the secondary direction SD, and the second portion 205B extends along the primary direction PD. However, the aforesaid pattern is an exemplary demonstration, the pattern of the conductive routing layer 205 may be varied depending on different design, manufacturing process, or testing considerations.

Figure 4:
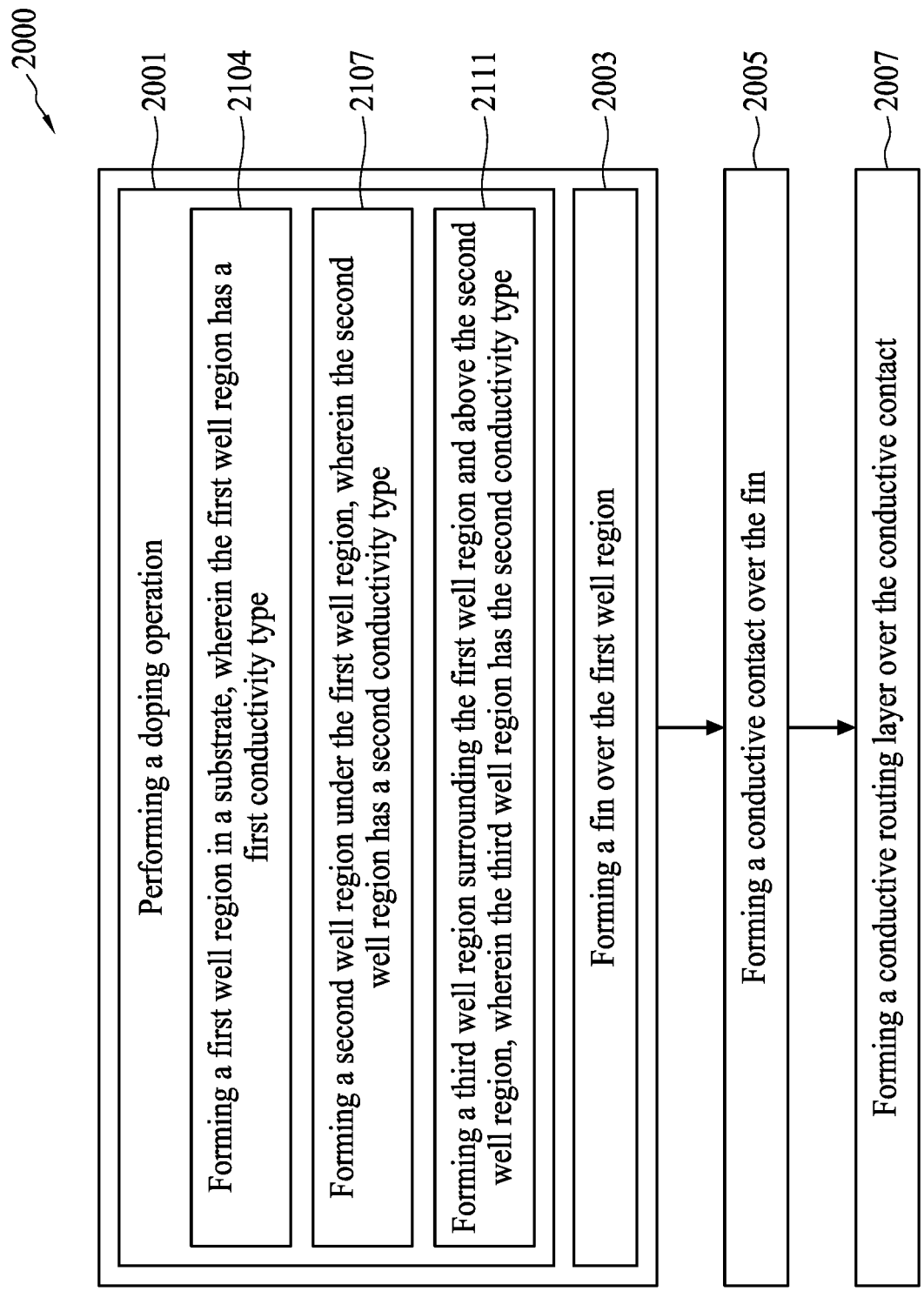
FIG. 4 shows a flow chart representing a method for fabricating a semiconductor structure, in accordance with some embodiments of the present disclosure.

Referring to FIG. 4, FIG. 4 shows a flow chart representing a method for fabricating a semiconductor structure, in accordance with some embodiments of the present disclosure. The method 2000 for fabricating a semiconductor structure includes performing a doping operation (operation 2001, which can be referred to FIG. 5A to FIG. 5C), forming a fin over the first well region (operation 2003, which can be referred to FIG. 5A to FIG. 5C), forming a conductive contact over the fin (operation 2005, which can be referred to FIG. 5A to FIG. 5C), and forming a conductive routing layer over the conductive contact (operation 2007, which can be referred to FIG. 5A to FIG. 5C). The operation of performing a doping operation (operation 2001) further includes forming a first well region in a substrate, wherein the first well region has a first conductivity type (sub-operation 2104, which can be referred to FIG. 5A to FIG. 5C), forming a second well region under the first well region (sub-operation 2107, which can be referred to FIG. 5A to FIG. 5C), wherein the second well region has a second conductivity type, and forming a third well region surrounding the first well region and above the second well region, wherein the third well region has the second conductivity type (sub-operation 2111, which can be referred to FIG. 5A to FIG. 5C).

Figure 5A:
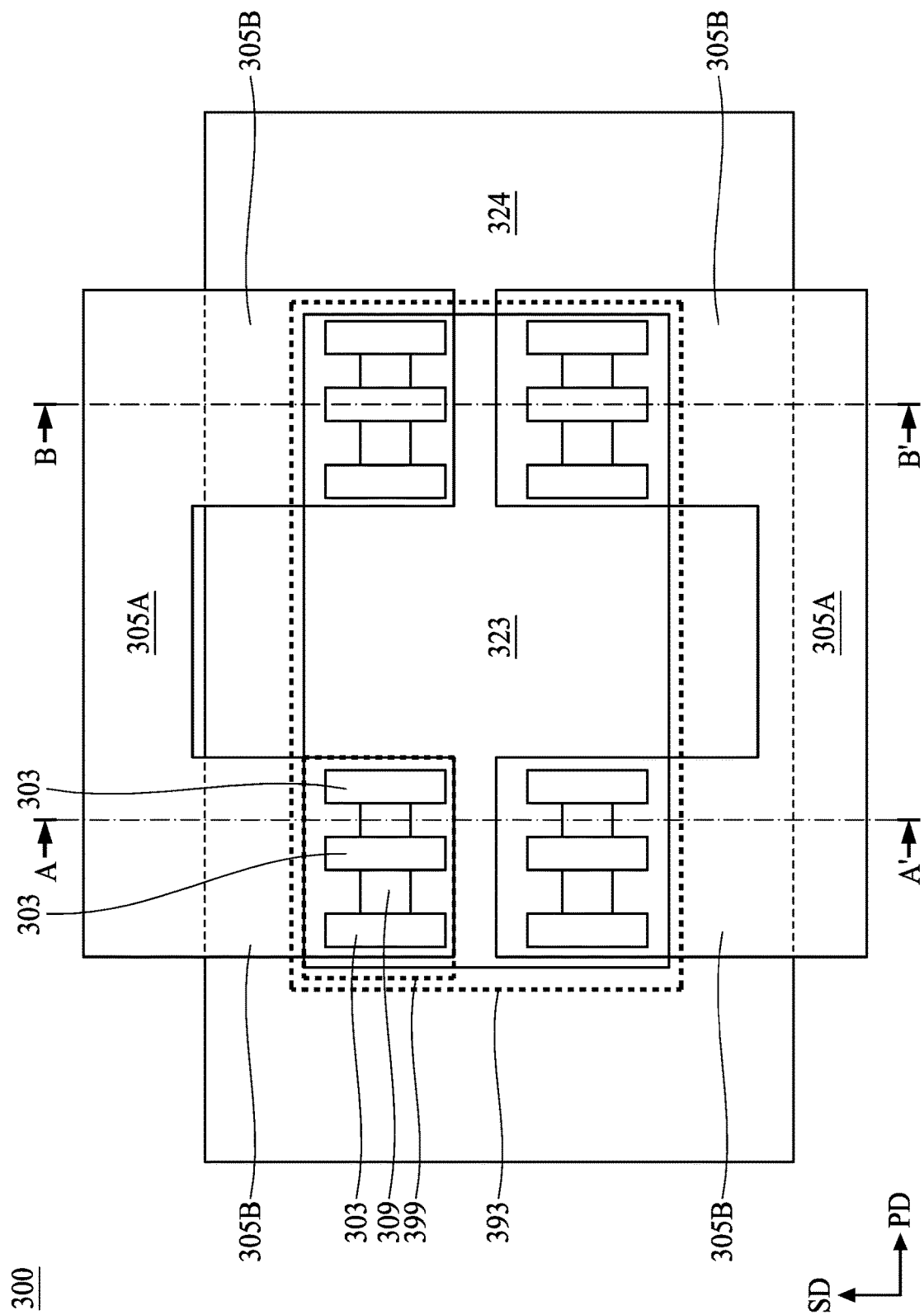
FIG. 5A is a top sectional view of a semiconductor structure, according to some embodiments of the present disclosure.
Figure 5B:
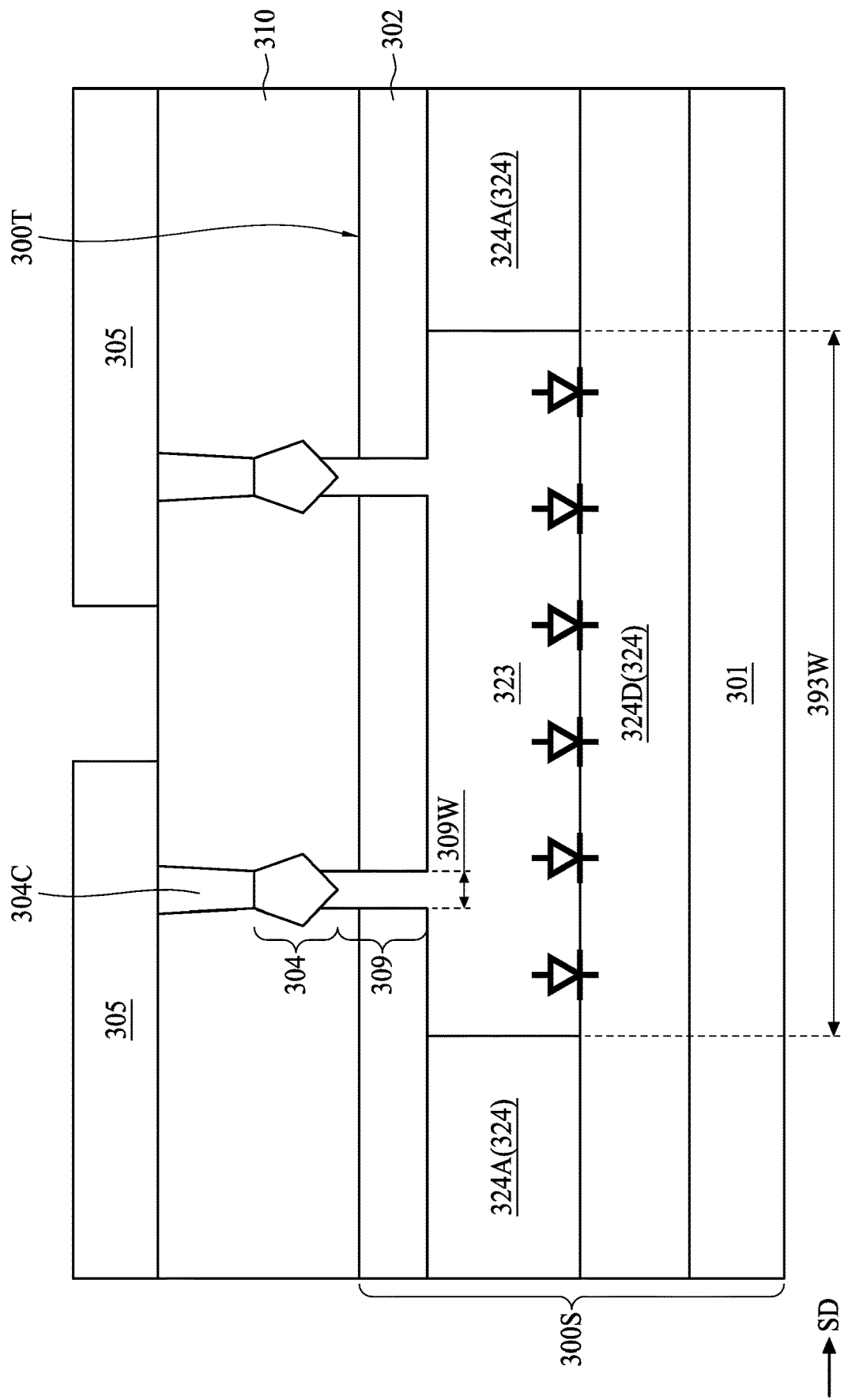
FIG. 5B is a schematic drawing illustrating a cross sectional view taken along line A-A' of FIG. 5A, according to some embodiments of the present disclosure.
Figure 5C:
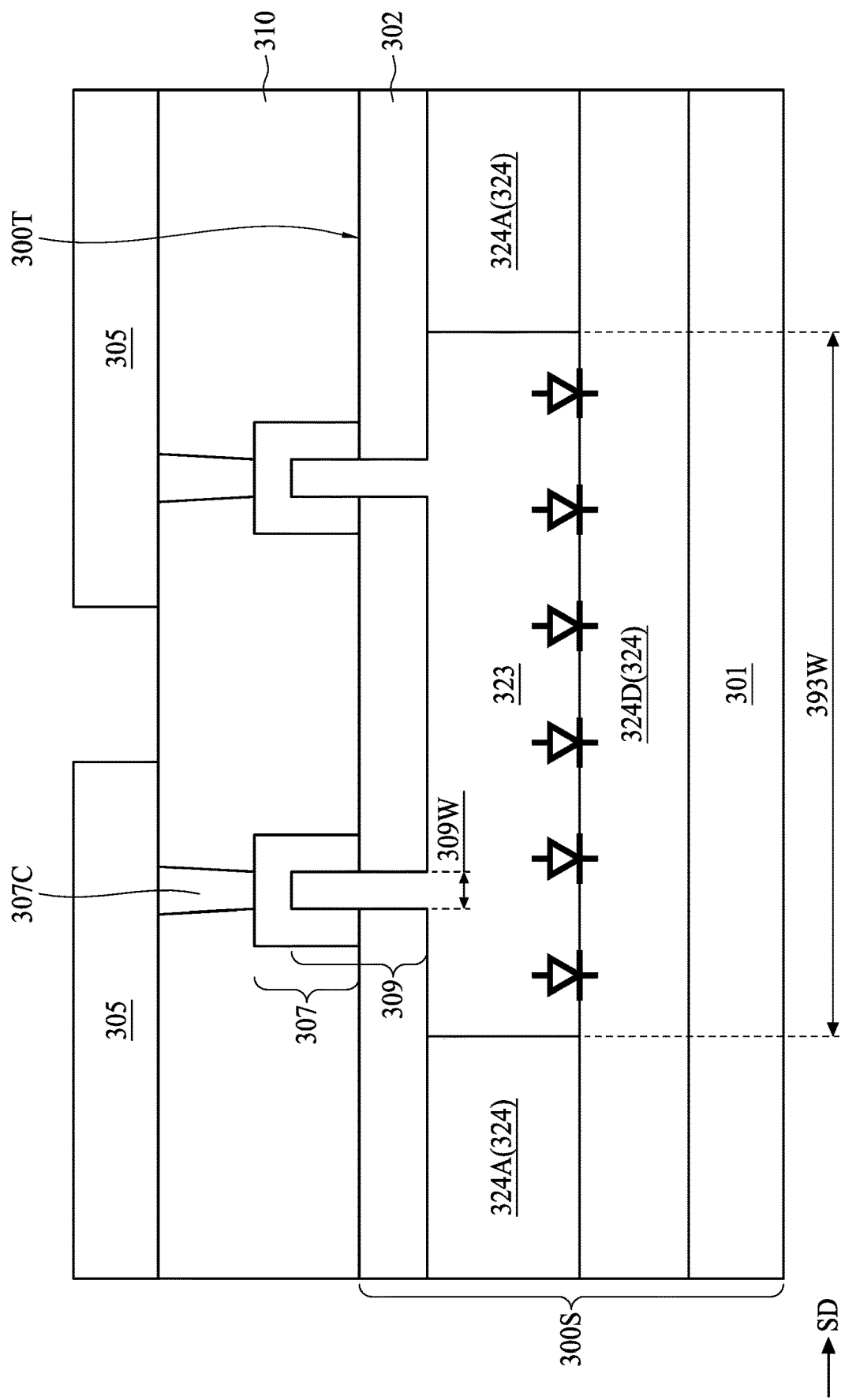
FIG. 5C is a schematic drawing illustrating a cross sectional view taken along line B-B' of FIG. 5A, according to some embodiments of the present disclosure.

Referring FIG. 5A to FIG. 5C, FIG. 5A is a top view of a semiconductor structure, according to some embodiments of the present disclosure, FIG. 5B is a schematic drawing illustrating a cross sectional view taken along line A-A' of FIG. 5A, FIG. 5C is a schematic drawing illustrating a cross sectional view taken along line B-B' of FIG. 5A. A semiconductor device 300 at least includes a substrate 300S, a fin 309 protruding from the substrate 300S, and a conductive routing layer 305 over the fin 309. The semiconductor device 300 further includes a gate 303 (which can be a metal gate, or the like) over and partially covers the fin 309. In some embodiments, a block 399 includes one or more fins 309 and one or more gates 303, wherein the semiconductor device 300 may include a plurality of blocks 299 (which may optionally be in repeated pattern). In the example provided in FIG. 5A, a plurality of fins 309 extends along a primary direction PD, and a plurality of the gates 303 extends along a secondary direction SD different from the primary direction PD. Optionally, the secondary direction SD is orthogonal to the primary direction PD. In some embodiments, the fins 309 and the gates 303 of the block 399 are entirely covered by (i.e. under a vertical projection of) the conductive routing layer 305 from a top view perspective (as shown in FIG. 5A). A semiconductor feature 304 is formed above the fin 309 and is adjacent to gates 303. In some embodiments, the semiconductor feature 304 includes epitaxial material, such as silicon germanium, or the like. Herein the fins 309 may be similar to the fins 209 discussed in FIG. 2 to FIG. 3D, the semiconductor feature 304 may be similar to semiconductor material 204EP discussed in FIG. 2 to FIG. 3D, and the gate 307 may be similar to the gate 203 discussed in FIG. 2 to FIG. 3D.

Similar to the previous discussion in FIG. 1 to FIG. 3C, in order to alleviate ESD issues (especially when performing other fabrication operations such as plasma operation), at least a portion of active region of the semiconductor device 300 is free from a vertical projection area of the conductive routing layer 305. Furthermore, an area of the junction region 393 is increased to further enhance the performance of alleviating the ESD issue.

As shown in FIG. 5A to FIG. 5C, the substrate 300S includes an isolation region 302 proximal to a top surface 300T of the substrate 300S, a first well region 323 under the isolation region 302, a second well region 324D under the first well region 323, a third well region 324A surrounding the first well region 323, and a fourth region 301 under the second well region 324D. The third well region 324A spaces between the second well region 324D. An interface between the first well region 323 and the second well region 324D is under and spaced away from the isolation region 302. The first well region 323 and the fourth well region 301 have a first conductivity type, and the second well region 324D, the third well region 324A have a second conductivity type. The first conductivity type is different from (or opposite to) the second conductivity type. For example, the first conductivity type is p-type and the second conductivity type is n-type. Alternatively, the first conductivity type is n-type and the second conductivity type is p-type. A plurality of fins 309 may be separated by the isolation regions 302.

By such configuration, the junction region 393 formed at the interface between the first well region 323 and the second well region 324D has a width 393W greater than a width 309W of the fin 309. Furthermore, at least a portion of the interface between the first well region 323 and the second well region 324D is free from the coverage of a vertical projection of the conductive routing layer 305, thus allowing some photons to propagate toward the interface without being blocked by the conductive routing layer 305. Optionally, the width 393W is greater than a distance between any two of the fins 309, wherein all the fins 309 are in a vertical projection area of a boundary of the first well region 323.

In some embodiments, the doping operations for forming the first well region 323, the second well region 324D, the third well region 324A and the fourth well region 301 can be performed before forming the fins 309. Alternatively, such doping operation can be performed after forming the fins 309. In some embodiments, the fourth well region 301 is formed before forming the second well region 324D, and the second well region 324D is formed before forming the first well region 323 and the third well region 324A.

The fin 309 is electrically coupled to the conductive routing layer 305. A first conductive contact 307C is formed above the gate 307, and a second conductive contact 304C is formed above the semiconductor feature 304. The first conductive contact 307C electrically connects the gate 307 and the conductive routing layer 305, and the second conductive contact 304C electrically connects the semiconductor feature 304 and the conductive routing layer 305. In some embodiments, the second conductive contact 304C includes conductive patterns, which is similar to the conductive pattern 204 as discussed in FIG. 3A to FIG. 3D. In some embodiments, the first conductive contact 307C and the second conductive contact 304C may be surrounded by an insulation layer 310, which may be similar to the insulation layer 210 discussed in FIG. 2 to FIG. 3D. In some embodiments, the first conductive contact 307C and/or the second conductive contact 304C can be formed by single damascene process, dual damascene process, or a combination of deposition and etching operations. Subsequent to forming the first conductive contact 307C, the second conductive contact 304C, and the insulation layer 310, the conductive routing layer 305 can be formed above the first conductive contact 307C, the second conductive contact 304C, and the insulation layer 310.

In the example provided in FIG. 5A, a first portion 305A of the conductive routing layer 305 is outside of a vertical projection of the fins 309 and the gates 307 of the block 399. The conductive routing layer 305 further includes one or more second portion 305B, wherein the gates 307 and the fins 309 are under the vertical projection of the conductive routing layer 305. In the example provided in FIG. 5A, the first portion 305A extends along the primary direction PD, and the second portion 305B extends along the secondary direction SD. However, the aforesaid pattern is an exemplary demonstration, the pattern of the conductive routing layer 305 may be varied depending on different design, manufacturing process, or testing considerations.

As previously discussed, increasing the junction leakage current induced in an area of the junction area 393 may alleviate electrostatic issue, wherein the junction leakage current may be induced by photons. By such configuration, a portion of an interface between the first well region 323 and the second well region 324D is free from a vertical projection of the conductive routing layer 305. As a result, a quantum efficiency of the semiconductor device 300 can be improved, thereby enhancing the performance of alleviating ESD issues.

The semiconductor structures discussed in the present disclosure can be incorporated into various types of devices, such as power management integrated circuit (PMIC) or other types of circuits. Specifically, in order to enhance the performance of semiconductor devices 200 and 300 for alleviating ESD issues, at least a portion of an active region (or junction diode region) is free from a vertical projection of the conductive routing layer 205 or 305, especially during performing fabrication operations that has the tendency of inducing electrostatic discharge, such as plasma operations.

In the examples of the semiconductor device 200, the positions of the vias 203V and 204V connected to the conductive routing layer 205 can be adjusted, allowing a through hole to be configured in the conductive routing layer 205 while retaining the function of electrical routing. Specifically, a portion of the fins 209, a portion of the gate 203, and a portion of the conductive patterns 204 are free from a vertical projection of the conductive routing layer 205.

In the examples of the semiconductor device 300, an area of an interface between the first well region 323 and the second well region 324D is expanded and spaced away from the isolation region 302. By having a larger active region, the magnitude of induced leakage current can also be increased. Furthermore, a portion of the interface between the first well region 323 and the second well region 324D is free from the coverage of the conductive routing layer 305, thereby allowing photons to propagate toward the junction region 393.

Some embodiments of the present disclosure provide a semiconductor structure, including a substrate, a fin over the substrate, wherein the fin extends along a primary direction, a gate over the fin, the gate extends along the secondary direction orthogonal to the primary direction, a first conductive contact over the gate, and a conductive routing layer over the first conductive contact, wherein at least a portion of the fin is free from the coverage of a vertical projection of the conductive routing layer.

Some embodiments of the present disclosure provide a semiconductor structure, including semiconductor device, including a substrate, including an isolation region proximal to a top surface of the substrate, a first well region under the isolation region, wherein the first well region has a first conductivity type, and a second well region under the first well region, wherein the second well region has a second conductivity type, an interface between the first well region and the second well region is under and spaced away from the isolation structure, a fin protruding from the first well region, and a conductive routing layer electrically coupled to the fin.

Some embodiments of the present disclosure provide a method for fabricating a semiconductor structure, including forming a first well region in a substrate, wherein the first well region has a first conductivity type, forming a second well region under the first well region, wherein the second well region has a second conductivity type, forming a third well region surrounding the first well region and above the second well region, wherein the third well region has the second conductivity type, forming a fin over the first well region, and forming a conductive routing layer over the fin.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;
   a fin over the substrate, wherein the fin extends along a primary direction;
   a gate over the fin, the gate extends along a secondary direction orthogonal to the primary direction;
   a first conductive contact over the gate, wherein a bottom surface of the first conductive contact overlaps with a top surface of the gate from a top view perspective; and
   a conductive routing layer over the first conductive contact, wherein at least a portion of the fin is free from the coverage of a vertical projection of the conductive routing layer.

2. The semiconductor device of claim 1, further comprising a conductive pattern over the fin, wherein the conductive pattern extends along the secondary direction.

3. The semiconductor device of claim 2, further comprising a second conductive contact connecting the conductive pattern and the conductive routing layer.

4. The semiconductor device of claim 1 wherein at least a portion of the gate is free from the coverage of a vertical projection of the conductive routing layer.

5. The semiconductor device of claim 1, wherein the fin comprises a conductive region adjacent to the gate, wherein at least a portion of the conductive region is free from the coverage of a vertical projection of the conductive routing layer.

6. The semiconductor device of claim 1, wherein the conductive routing layer is a first metal layer over the substrate.

7. A semiconductor device, comprising:
   a substrate, comprising:
      an isolation region proximal to a top surface of the substrate;
      a first well region under the isolation region, wherein the first well region has a first conductivity type; and
      a second well region under the first well region, wherein the second well region has a second conductivity type, an interface between the first well region and the second well region is under and spaced away from the isolation region;
   a fin protruding from the first well region; and
   a conductive routing layer electrically coupled to the fin.

8. The semiconductor device of claim 7, further comprising a third well region surrounding the first well region, wherein the third well region spaces between the second well region and the isolation region, the third well region has the second conductivity type.

9. The semiconductor device of claim 7, wherein at least a portion of the interface between the first well region and the second well region is free from the coverage of a vertical projection of the conductive routing layer.

10. The semiconductor device of claim 7, wherein the interface between the first well region and the second well region has a width wider than a width of the fin.

11. The semiconductor device of claim 7, further comprising:
   an epitaxial feature on the fin; and
   a conductive contact between the epitaxial feature and the conductive routing layer.

12. The semiconductor device of claim 7, wherein the substrate comprises a fourth well region under the second well region, wherein the fourth well region has the first conductivity type.

13. The semiconductor device of claim 7, further comprising a gate, wherein the gate is entirely covered by the conductive routing layer from a top view perspective.

14. The semiconductor device of claim 7, wherein the fin is entirely covered by the conductive routing layer from a top view perspective.

15. A method for fabricating a semiconductor structure, comprising:
 forming a first well region in a substrate, wherein the first well region has a first conductivity type;
 forming a second well region under the first well region, wherein the second well region has a second conductivity type;
 forming a third well region surrounding the first well region and above the second well region, wherein the third well region has the second conductivity type;
 forming a fin over the first well region; and
 forming a conductive routing layer over the fin.

16. The method of claim 15, wherein at least a portion of the first well region is free from the coverage of a vertical projection of the conductive routing layer.

17. The method of claim 15, wherein at least a portion of an interface between the first well region and the second well region is free from the coverage of a vertical projection of the conductive routing layer.

18. The method of claim 15, further comprising performing a plasma operation over the substrate.

19. The method of claim 15, further comprising forming a conductive contact connecting to the fin prior to forming the conductive routing layer.

20. The method of claim 15, further comprising forming an isolation region proximal to a top surface of the substrate.

* * * * *